United States Patent
Goh et al.

(10) Patent No.: US 9,718,672 B2
(45) Date of Patent: Aug. 1, 2017

(54) ELECTRONIC DEVICES INCLUDING SUBSTANTIALLY HERMETICALLY SEALED CAVITIES AND GETTER FILMS WITH KELVIN MEASUREMENT ARRANGEMENT FOR EVALUATING THE GETTER FILMS AND METHODS FOR FABRICATING THE SAME

(71) Applicant: Globalfoundries Singapore Pte. Ltd., Singapore (SG)

(72) Inventors: Szu Huat Goh, Singapore (SG); Edy Susanto, Singapore (SG); Jeffrey Lam, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/985,093

(22) Filed: Dec. 30, 2015

(65) Prior Publication Data

US 2016/0347608 A1 Dec. 1, 2016

Related U.S. Application Data

(60) Provisional application No. 62/166,763, filed on May 27, 2015.

(51) Int. Cl.
*B81B 7/00* (2006.01)

(52) U.S. Cl.
CPC .................. *B81B 7/0038* (2013.01)

(58) Field of Classification Search
CPC .............. H03H 9/02244; B81B 7/0038; B81C 1/00285
See application file for complete search history.

(56) References Cited

U.S. PATENT DOCUMENTS

| 6,923,625 B2 | 8/2005 | Sparks |
| 8,605,445 B2 | 12/2013 | Baillin |
| 2008/0049386 A1* | 2/2008 | Pornin ................ B81C 1/00285 361/820 |
| 2016/0049918 A1* | 2/2016 | Moulard ............... B81B 7/0038 333/186 |

OTHER PUBLICATIONS

Chae et al., "Fabrication and Characterization of a Wafer-Level MEMS Vacuum Package With Vertical Feedthroughs", Journal of Microelectromechanical Systems, Feb. 2008, pp. 193-200, vol. 17. No. 1.
Ramesham, "Evaluation of Non-Evaporable Getters for High Vacuum Hermetic Packages", NEPP Program Document, JPL D-27440, pp. 1-31.

(Continued)

*Primary Examiner* — Dung Le
(74) *Attorney, Agent, or Firm* — Lorenz & Kopf, LLP (57) ABSTRACT

Electronic devices and methods for fabricating electronic devices are provided. In one example, an electronic device includes an electronic device body structure having a substantially hermetically sealed cavity formed therein. A getter film is in fluid communication with the substantially hermetically sealed cavity. Conductive features are accessible from outside the substantially hermetically sealed cavity and are operatively coupled to the getter film for electrical communication with the getter film.

18 Claims, 4 Drawing Sheets

(56) References Cited

OTHER PUBLICATIONS

Ramesham, "Getters for Reliable Hermetic Packages", JPL Publication D-17920 Oct. 18, 1999, 3 pages, EEE Links Vo. 6 No. 1.
Reinert et al., "Assessment of Vacuum Lifetime in nL-Packages", Electronics Packaging Technology Conference, 2005, pp. 225-230.
Sciuccati et al., "In situ pumping with NEG (non-evaporable getters) during vacuum processing", Vacuum, 1988, pp. 765-769, vol. 38, No. 8-10.
Sparks et al, "Reliable Vacuum Packaging Using NanoGetterstm and Glass Frit Bonding", Reliability, Testing and Characterization of MEMS/MOEMS III ed. D. Tanner & R. Ramesham, Proc SPIE, Jan. 2004, pp. 70-78, vol. 5343.

* cited by examiner

ELECTRONIC DEVICES INCLUDING SUBSTANTIALLY HERMETICALLY SEALED CAVITIES AND GETTER FILMS WITH KELVIN MEASUREMENT ARRANGEMENT FOR EVALUATING THE GETTER FILMS AND METHODS FOR FABRICATING THE SAME

CROSS-REFERENCE TO RELATED APPLICATIONS

This application is related to and claims all available benefit of U.S. Provisional Patent Application 62/166,763 filed May 27, 2015, the entire contents of which are herein incorporated by reference.

TECHNICAL FIELD

The technical field relates generally to electronic devices, and more particularly relates to electronic devices including substantially hermetically sealed cavities and getter films in fluid communication with the substantially hermetically sealed cavities, for example, for producing and/or maintaining a vacuum condition in the substantially hermetically sealed cavities, and methods for fabricating such electronic devices.

BACKGROUND

Integration of a vacuum cavity into numerous electronic devices, such as micro-electro-mechanical system (MEMS) devices and the like, enables the performance of the device to be improved. MEMS devices generally range in size from about 20 micrometer (μm) to about a millimeter (mm) and can be combined with digital driving and/or detection cores like microprocessors to form a monolithic MEMS or can include a microprocessor with several other components, such as micro-sensors (e.g., pressure sensors, inertial sensors, and/or the like), and that interact with the surroundings and can be encapsulated in the vacuum cavity to enhance performance. However, the encapsulation of various components/elements of the device in a vacuum gives rise to a number of challenges, such as preservation of the vacuum condition with time and the quality of the encapsulated atmosphere.

The use of getter materials to adsorb or getter gases is a well-known technique for improving the performance of electronic devices that have a substantially sealed cavity for containing one or more components/elements of the device in a vacuum condition environment. In particular, the getter material(s) can be activated (e.g., by exposure to heat) to form a porous matrix that captures (e.g., absorb and/or adsorb) numerous gases with which they are in contact, for example, by surface adsorption and/or by absorbing and reacting with the gases to form an oxide, a hydride, or the like. In this way, gases that may be desorbed from other surrounding materials of the electronic device and/or that are produced during fabrication of the electronic device can be captured by the getter material to help maintain the vacuum condition in the substantially sealed cavity by absorbing and/or adsorbing these gases. Unfortunately, current approaches for determining and/or monitoring if the getter material(s) is functioning properly to produce and/or maintain the vacuum condition in the electronic device are complex, requiring either destructive chemical analysis, designated circuitry, or special gauge arrangements incorporated into the electronic device.

Accordingly, it is desirable to provide electronic devices with substantially sealed cavities, which may provide a vacuum condition environment, and getter materials in which the performance of the getter material for producing and/or maintaining the vacuum condition in the substantially sealed cavity can be more practically evaluated and/or monitored compared to current approaches, and methods for fabricating such electronic devices. Furthermore, other desirable features and characteristics of the present invention will become apparent from the subsequent detailed description and the appended claims, taken in conjunction with the accompanying drawings and this background.

BRIEF SUMMARY

Electronic devices and methods for fabricating electronic devices are provided herein. In accordance with an exemplary embodiment, an electronic device includes an electronic device body structure having a substantially hermetically sealed cavity formed therein. A getter film is in fluid communication with the substantially hermetically sealed cavity. Conductive features are accessible from outside the substantially hermetically sealed cavity and are operatively coupled to the getter film for electrical communication with the getter film.

In accordance with another exemplary embodiment, a method for fabricating an electronic device is provided. The method includes activating a getter film that is in fluid communication with a substantially hermetically sealed cavity in an electronic device body structure of the electronic device to form an activated getter film. A resistance of the activated getter film is determined for evaluating if the activated getter film can effectively absorb and/or adsorb gas to produce and/or maintain a vacuum condition in the substantially hermetically sealed cavity.

In accordance with another exemplary embodiment, a method for fabricating an electronic device is provided. The method includes forming a getter film overlying a first portion of an electronic device body structure. Conductive features are formed extending through the first portion of the electronic device body structure for operatively coupling the conductive features with the getter film for electrical communication with the getter film. The first portion of the electronic device body structure is sealed with a second portion of the electronic device body structure to form a substantially hermetically sealed cavity in the electronic device body structure such that the getter film is in fluid communication with the substantially hermetically sealed cavity and the conductive features are accessible from outside the substantially hermetically sealed cavity.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following Detailed Description is merely exemplary in nature and is not intended to limit the various embodiments or the application and uses thereof. Furthermore, there is no intention to be bound by any theory presented in the preceding background or the following detailed description.

Embodiments of the present disclosure are generally directed to electronic devices and methods for fabricating the same. For the sake of brevity, conventional techniques related to electronic device fabrication may not be described in detail herein. Moreover, the various tasks and process steps described herein may be incorporated into a more comprehensive procedure or process having additional steps or functionality not described in detail herein. In particular, various steps in the manufacture of electronic devices are well-known and so, in the interest of brevity, many conventional steps will only be mentioned briefly herein or will be omitted entirely without providing the well-known process details. Further, it is noted that electronic devices include a varying number of components and that single components shown in the illustrations may be representative of multiple components.

As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. Further, spatially relative terms, such as "upper," "over," "lower," "under," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

As described herein, electronic devices and methods for fabricating electronic devices are provided. In an exemplary embodiment, an electronic device includes an electronic device body structure that has a first portion and a second portion. During an intermediate fabrication stage(s), the first portion and the second portion of the electronic device body structure may be processed as separate wafers or wafer assemblies. A getter film (e.g., one or more layers of getter material) is formed overlying the first portion of the electronic device body structure, for example, on a recessed section of the first portion. Conductive features, such as conductive vias in electrical communication with conductive surface pads, are formed extending through the first portion of the electronic device body structure for establishing electrical communication between the conductive surface pads and the getter film.

The first portion of the electronic device body structure is sealingly coupled to the second portion of the electronic device body structure to form a substantially hermetically sealed cavity in the electronic device body structure. As used herein, the phrase "hermetically sealed cavity" is understood to mean a cavity that is sealed to be impervious to gases, with gas prevented from entering into or escaping from the cavity under atmospheric pressure. As used herein, the phrase "substantially hermetically sealed cavity" is understood to mean a cavity that has been sealed by a production sealing process intended to hermetically seal the cavity but that may not be technically "hermetically sealed" due to a less than ideal production sealing process, subject to typical manufacturing tolerances and limitations that can result in a sealed cavity that is nearly impervious to gases but not fully or completely impervious to gases. In an exemplary embodiment, the getter film is in fluid communication with the substantially hermetically sealed cavity for gettering gases and the conductive features can be electrically accessed from outside the substantially hermetically sealed cavity (e.g., through conductive surface pads that are electrically coupled to the conductive vias and that are exposed on an outer surface of the electronic device body structure) for electrical communication with the getter film.

In an exemplary embodiment and as will be discussed in further detail below, the getter film is an activated getter film for absorbing and/or adsorbing gases. It has been found that when the getter film is properly or substantially fully activated, the getter film has a relatively higher electrical resistance compared to non-activated or not fully activated or partially functioning getter films. In an exemplary embodiment, using the conductive features, electrical communication (e.g., sending electrical inputs and receiving electrical responses) with the activated getter film from outside the substantially hermetically sealed cavity occurs to determine a resistance of the activated getter film for evaluating if the activated getter film can effectively absorb and/or adsorb gases to produce and/or maintain a vacuum condition in the substantially hermetically sealed cavity. In an exemplary embodiment, if the resistance of the activated getter film is relatively higher, then the getter film is functioning properly to getter gases. Alternatively, if the resistance of the activated getter film is relatively lower, then the getter film cannot sufficiently absorb and/or adsorb gases. As such, the performance of the getter film to getter gases for producing and/or maintaining a vacuum condition can be efficiently evaluated and/or monitored from outside the electronic device body structure without requiring either destructive chemical analysis or designated circuitry or special gauge arrangements incorporated into the electronic device.

Figure 1:
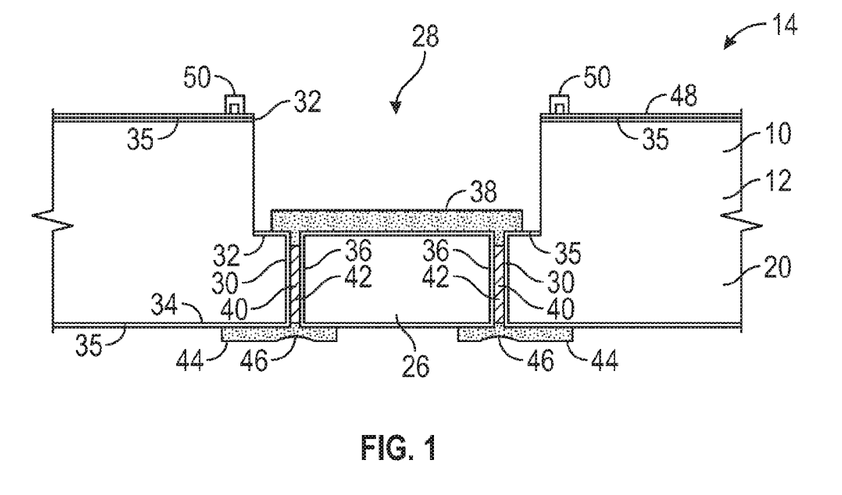
FIGS. 1-5 illustrate, in cross-sectional views, an electronic device and a method for fabricating the electronic device during various intermediate fabrication stages in accordance with an exemplary embodiment.
Figure 2:
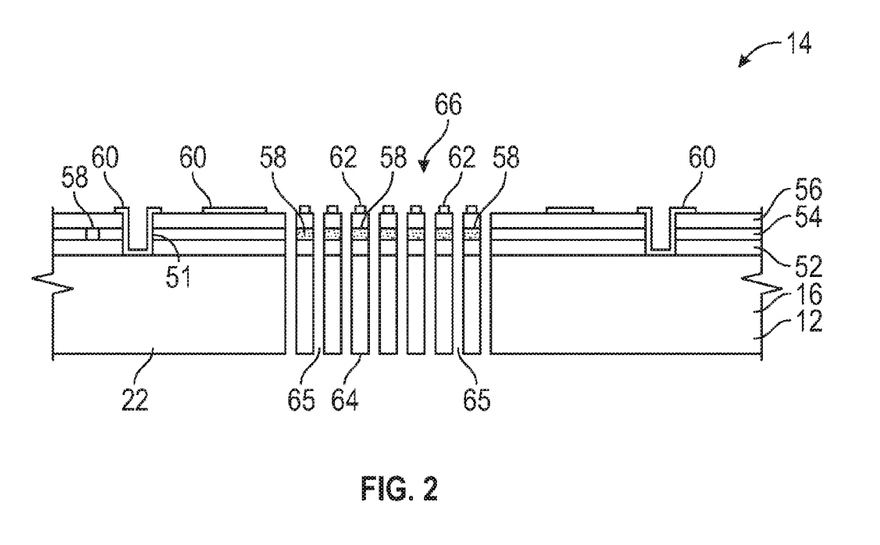
Figure 3:
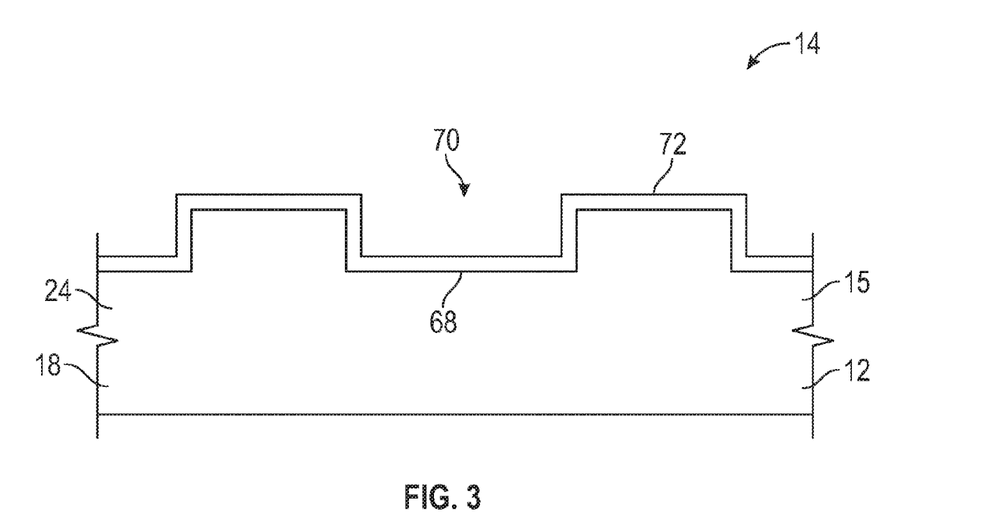
Figure 5:
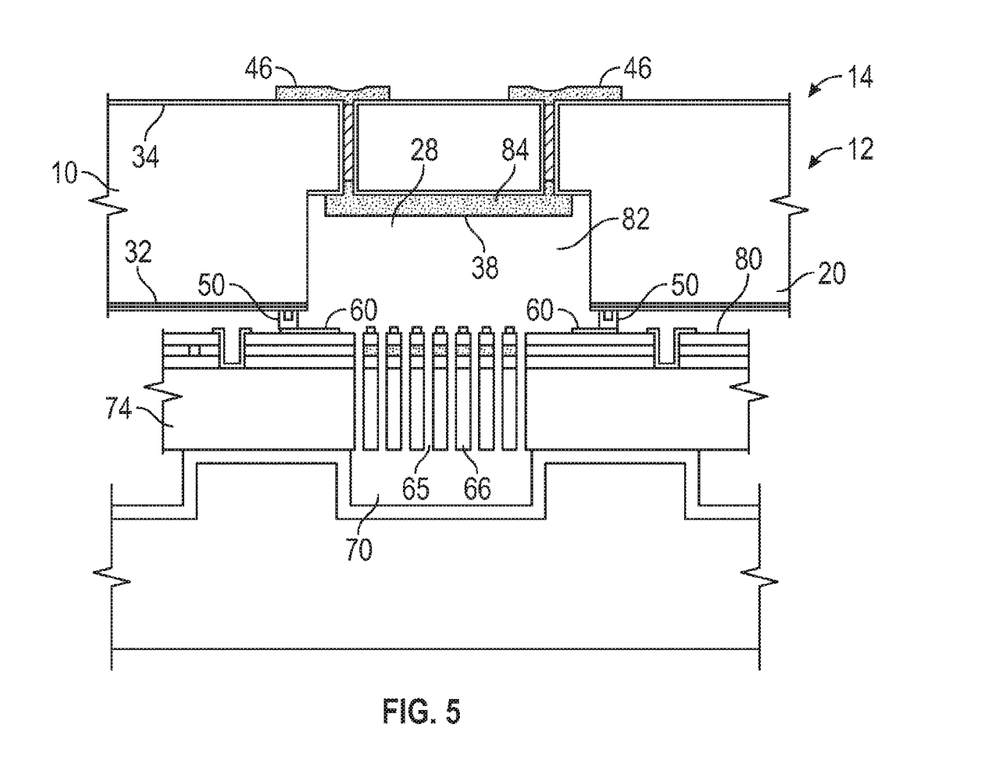

FIG. 1 illustrates a portion 10 (e.g., capping wafer of MEMS device) of an electronic device body structure 12 of an electronic device 14 during an intermediate fabrication stage in accordance with an exemplary embodiment. FIG. 2 illustrates a portion 16 (e.g., MEMS device wafer) of the electronic device body structure 12 during another intermediate fabrication stage in accordance with an exemplary embodiment. FIG. 3 illustrates a portion 18 (e.g., holding or carrier wafer) of the electronic device body structure 12 during another intermediate fabrication stage in accordance with an exemplary embodiment. As illustrated in FIGS. 1-3, the portions 10, 16, and 18 of the electronic device body structure 12 are three separate parts that will be subsequently sealingly coupled together as discussed below to substantially complete assembly of the electronic device body structure 12 as shown in FIG. 5. It is however to be understood that the electronic device body structure 12 can be formed of less than three portions (e.g., two portions) or more than three portions. Moreover, it is to be understood that although the portions 10, 16, and 18 of the electronic device body structure 12 are shown as separate parts during various fabrication stages, that any two or more of the portions can be assembled together prior to, during, or subsequent to the fabrication stages as shown in FIGS. 1-3.

In an exemplary embodiment, the portions 10, 16, and 18 of the electronic device body structure 12 include semiconductor substrates 20, 22, and 24, respectively, which may represent any appropriate carrier material, such as silicon or silicon-based materials, and the like. As used herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, 'semiconductor material' encompasses other materials such as relatively pure and impurity-doped germanium, gallium arsenide, zinc oxide, glass, and the like. An exemplary semiconductor material is a silicon substrate. The silicon substrate may be a bulk silicon wafer or may be a thin layer of silicon on an insulating layer (commonly known as silicon-on-insulator or SOI) that, in turn, is supported by a carrier wafer.

Referring to FIG. 1, the portion 10 of the electronic device body structure 12 has a recessed section 26 in the semiconductor substrate 20 that defines a cavity 28. Formed through the recessed section 26 are via-holes 30 that extend between inner and outer surfaces 32 and 34 of the semiconductor substrate 20. As illustrated, on the inner and outer surfaces 32 and 34 of the semiconductor substrate 20 is an oxide layer 35 (e.g., $SiO_2$). A liner layer 36 is disposed along the sidewalls of the via-holes 30.

As illustrated, disposed in the cavity 28 overlying the recessed section 26 of the portion 10 is a getter film 38. Although the getter film 38 is shown disposed in the cavity 28, it is to be understood that other embodiments may encompass providing the semiconductor substrate 20 without the recessed section 26 and that the getter film 38 as such is disposed on the inner surface 32 above (or below depending upon the orientation) the semiconductor substrate 20 without being in a cavity. The getter film 38 may be formed of one or more layers of getter material(s), and optionally, may include a protective and/or non-reactive layer(s) over and/or interposed in the getter material(s). Getter material(s) suitable for the getter film 38 generally encompasses those materials that readily adsorb and/or absorb/react with oxygen, hydrogen, nitrogen, water, carbon monoxide, carbon dioxide, and hydrocarbons. Non-limiting examples of getter materials include Al, carbon, Si, Ge, all Group 1A, 2A, 3A, 4A, 4B, 5A, 6A, and 7A elements, and compounds or alloys containing one or more these elements. Exemplary getter materials include Al, Ba, carbon, Ca, Ce, Cr, Co, Fe, Hf, Mg, Mn, Mo, Nb, Ni, Si, Ta, Ti, Th, V, W, and Zr, and compounds or alloys containing one or more these elements. Other getter materials known to those skilled in the art may also be used including, for example, alloy getter materials or the like.

A conductive fill 40 is disposed in the via-holes 30 overlying the liner layer 36. The conductive fill 40 with the liner layer 36 together form conductive vias 42. In an exemplary embodiment, electrically coupled to the conductive vias 42 are conductive pads 44 that are disposed adjacent to the outer surface 34 on the oxide layer 35. Together the conductive pads 44 and the conductive vias 42 form conductive features 46 for electrical communication with the getter film 38.

As illustrated, a nitride layer 48 (e.g., $Si_3N_4$) may optionally overlie a portion of the oxide layer 35 that is disposed along the inner surface 32 laterally adjacent to the cavity 28. Surrounding the cavity 28 are bonding features 50 (e.g., germanium layer). As will be discussed in further detail below, in an exemplary embodiment, the bonding features 50 are used to sealingly couple the portions 10 and 16 of the electronic device body structure 12 together.

With continuing reference to FIG. 1, the illustrated portion 10 of the electronic device 14 may be formed in accordance with conventional techniques. In an exemplary embodiment, the semiconductor substrate 20 is patterned and etched using, for example, a patterned mask and an etch process, such as a plasma silicon etch or a wet etch, for example, a wet etch using potassium hydroxide (KOH) or tetramethyl ammonium hydroxide (TMAH), or Deep Reactive Ion Etching (DRIE) process. The exemplary etch process is anisotropic and forms the recessed section 26 defining the cavity 28. The oxide layer 35 may be formed overlying the inner and outer surfaces 32 and 34 by depositing a silicon oxide material, for example, by a chemical vapor deposition (CVD) process.

Next, a getter film-forming material (e.g., getter material(s) or precursor thereof) is deposited in one or more layers overlying the oxide layer 35 adjacent to the inner surface 32. In an exemplary embodiment, the getter film-forming material is deposited under vacuum by sputtering, though various other techniques could be employed, including CVD, plasma deposition, spin-on deposition, spraying, screen printing, and other film deposition methods. After deposition, the getter film-forming material can be patterned using common photolithography and etch methods, lift-methods, shadow masking, or other techniques commonly employed in the electronics industry to form the getter film 38.

If present, the nitride layer 48 may be formed overlying the oxide layer 35 laterally adjacent to the cavity 28 by depositing and patterning a nitride material ($Si_3N_4$). Next, the bonding features 50 are formed, for example, by depositing and patterning a layer of bonding material such as germanium. In an exemplary embodiment, the bonding material is deposited by physical vapor deposition (PVD) or low pressure chemical vapor deposition (LPCVD).

In an exemplary embodiment, the semiconductor substrate 20 is flipped or rotated 180 degrees relative to the orientation of the portion 10 of the electronic device body structure 12 as illustrated in FIG. 1 such that the outer surface 34 would be at the top of the Figure. The exemplary method may continue with a via formation process. Note, without being limited to any specific fabrication sequence, for example, at some point either before or after forming the getter film 38, the via-holes 30 may be formed into the semiconductor substrate 20. However, for the sake of providing at least one example of via formation, the process described below is understood to be non-limiting and that other via formation sequences are possible and encompassed with the various embodiments described herein. In particular, a mask is formed and patterned over the oxide layer 35 adjacent to the outer surface 34 of the semiconductor substrate 20. The via-holes 30 can be etched utilizing a number of conventionally-known processes, including a DRIE process.

Next, the mask is removed and the liner layer 36 is formed along the sides of the via-holes 30. An exemplary liner layer 36 is formed of a liner-forming material, such as silicon oxide. In an exemplary embodiment, the liner-forming material is deposited by a CVD or LPCVD process.

After formation of the liner layer 36, the method may continue with the deposition of the conductive fill 40 to complete formation of the conductive vias 42 in each of the via-holes 30. An exemplary conductive fill is doped polysilicon. In an exemplary embodiment, the conductive fill 40 is deposited by an in-situ LPCVD process. The conductive fill 40 is deposited to fill the via-holes 30 and may form an overburden portion over the outer surface 34 of the semiconductor substrate 20. Any overburden portion may be removed by a chemical mechanical planarization (CMP) process.

The method continues with the formation of the conductive pads 44 that are electrically coupled to the conductive vias 42. The conductive pads 44 are formed by depositing a conductive layer material such as polysilicon overlying the outer surface 34 of the semiconductor substrate 20. In an exemplary embodiment, the polysilicon is deposited over the outer surface 34 by a LPCVD process. After depositing the conductive layer material, a mask may be formed and patterned over the conductive layer material and the conductive layer material is etched to form the conductive pads 44. The mask is then removed.

Referring to FIG. 2, the portion 16 of the electronic device body structure 12 includes the semiconductor substrate 22 as discussed above and a plurality of oxide layers 52, 54, and 56 (e.g., $SiO_2$) overlying the semiconductor substrate 22. Extending through the oxide layers 52, 54, and 56 are trenches 51 and disposed in and/or on the oxide layers 52, 54, and 56 are conductive features 58, features 60, and conductive features 62 (e.g., aluminum, aluminum alloy, or the like). A comb structure 64 extends through the oxide layers 52, 54, and 56, and the semiconductor substrate 22 and defines sensing elements 66. In an exemplary embodiment, the electronic device 14 is a micro-electro-mechanical system (MEMS) device and the sensing elements 66 are configured as conventional MEMS sensors, such as, for example, MEMS inertia sensors, or the like.

The illustrated portion 16 of the electronic device 14 may be formed in accordance with conventional techniques. In an exemplary embodiment, the oxide layer 52 may be formed by depositing a silicon oxide material, for example, by a CVD process. Next, the conductive features 58 are formed, for example, by depositing and patterning a layer of conductive material such as aluminum, aluminum alloy, or the like over the oxide layer 52. In an exemplary embodiment, the conductive material is deposited by a sputtering process. The method continues by depositing a silicon oxide material, for example, by a CVD process to form the oxide layers 54 and 56. The oxide layer 56 may be planarized via a CMP process.

The trenches 51 are etched through the oxide layers 52, 54, and 56 to the upper surface of the semiconductor substrate 22. The trenches 51 can be formed utilizing a number of conventionally-known processes, including DRIE. Next, the features 60 and 62 are formed by depositing and patterning a conductive material such as aluminum, aluminum alloy, or the like. In an exemplary embodiment, the material is deposited by a sputtering process.

The method continues by forming the comb structure 64. For example, a mask may be formed and patterned over the oxide layer 56 and the features 60 and 62. Then the oxide layers 52, 54, and 56 and the semiconductor substrate 22 are etched to form holes 65 extending therethrough to define the comb structure 64. The oxide layers 52, 54, and 56 and the semiconductor substrate 22 may be etched utilizing a number of conventionally-known processes, including DRIE.

Referring to FIG. 3, the portion 18 of the electronic device body structure 12 includes the semiconductor substrate 24 with a recessed section 68 that defines a cavity 70 in the semiconductor substrate 24. Overlying the semiconductor substrate 24 including over the recessed section 68 is an oxide layer 72.

The illustrated portion 18 of the electronic device 14 may be formed in accordance with conventional techniques. In an exemplary embodiment, the semiconductor substrate 24 is patterned and etched using, for example, a patterned mask and an etch process, such as DRIE. The exemplary etch process is anisotropic and forms the recessed section 68 defining the cavity 70. The oxide layer 72 may be formed overlying the semiconductor substrate 24 by depositing a silicon oxide material, for example, by a CVD process.

Figure 4:
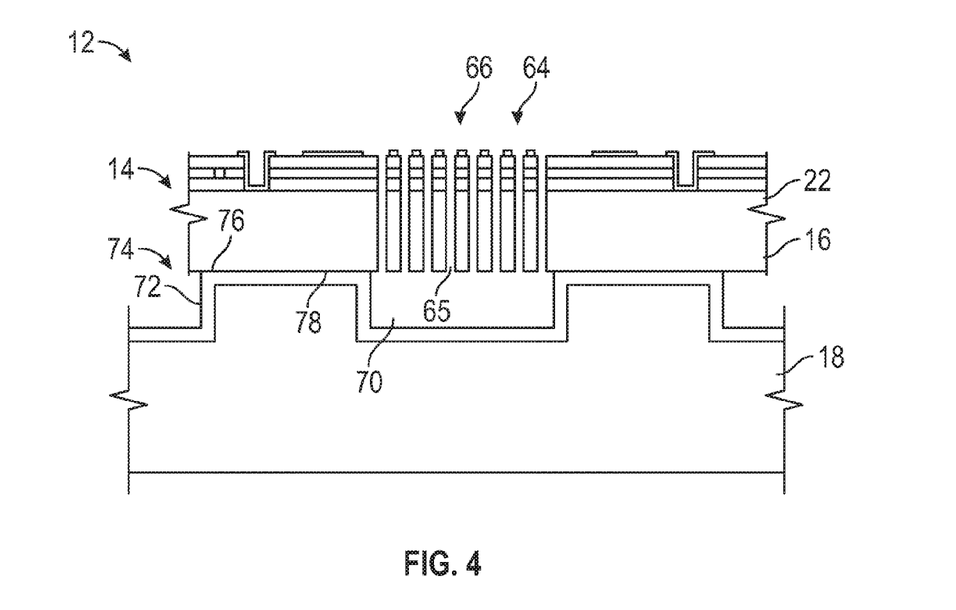

In embodiments, the method continues as illustrated FIG. 4 by sealingly coupling the portions 16 and 18 together to form a portion 74 (e.g., combined portion 74) of the electronic device body structure 12 in a partially assembled condition. In particular, the lower surfaces 76 of the of the semiconductor substrate 22 that are laterally adjacent to the sensing elements 66 are correspondingly sealingly coupled with the upper surfaces 78 of the oxide layer 72 that are laterally adjacent to the cavity 70. As such, the sensing elements 66 directly overlie the cavity 70 such that the holes 65 of the comb structure 64 are in fluid communication with the cavity 70.

The illustrated portion 74 of the electronic device 14 may be sealingly coupled in accordance with conventional techniques. In an exemplary embodiment, the portions 16 and 18 of the electronic device body structure 12 are sealingly coupled together using, for example, the portions 16 and 18 are fused together at high temperature(s) to form the portion 74 of the electronic device 14.

In embodiments and referring to FIG. 5, the method continues by sealingly coupling the portions 10 and 74 together to form the electronic device body structure 12 in a substantially fully assembled condition for further processing. In particular, the portions 10 and 74 of the electronic device body structure 12 are bonded together with the inner surface 32 of the semiconductor substrate 20 facing towards an upper surface 80 of the portion 74. In an exemplary embodiment, the portions 10 and 74 of the electronic device body structure 12 are bonded via a eutectic bonding process. Specifically, the bonding features 50 that are adjacent to the inner surface 32 of the semiconductor substrate 20 are aligned and in contact with portions of the features 60 adjacent to the upper surface 80 of the portion 74 of the electronic device body structure 12. In an exemplary embodiment, the material(s) (e.g., germanium or the like) that form the bonding features 50 are selected to form a eutectic bond with the features 60, thereby forming a seal between the portions 10 and 74 of the electronic device body structure 12.

In an exemplary embodiment, after bonding, the electronic device body structure 12 has a substantially hermetically sealed cavity 82 that is enclosed within the structure 12. In particular, the substantially hermetically sealed cavity 82 includes the cavity 28, the holes 65 extending between the sensing elements 66, and the cavity 70. As illustrated, the sensing elements 66 and the getter film 38 are disposed within and in fluid communication with the substantially hermetically sealed cavity 82. Additionally and as discussed above, the conductive features 46 are electrically accessible from outside the substantially hermetically sealed cavity 82 and are operatively coupled to the getter film 38 for electrical communication with the getter film 38.

In an exemplary embodiment, the getter film 38 is activated to form an activated getter film 84 that effectively absorbs and/or adsorbs gas to produce and/or maintain a vacuum condition in the substantially hermetically sealed cavity 82. In one example, the getter film 38 is activated by heating the electronic device body structure 12 to form the activated getter film 84. In an exemplary embodiment, the getter film 38 is activated during eutectic bonding as described above, which includes heating the electronic device body structure 12 to form the eutectic bonds. In an exemplary embodiment, the getter film 38 is heated to a temperature of from about 300 to about 400° C. for a time of from about 7 to about 10 minutes to form the activated getter film 84 (and the eutectic bonds).

In an exemplary embodiment, the getter film 38 before activation (e.g., either prior to and/or after forming the substantially hermetically sealed cavity 82) has a lower resistance than the activated getter film 84. In an exemplary embodiment, and as will be discussed in further detail below, the getter film 38 before activation has a resistance of less than 0.5 ohms per square meter (ohms/m$^2$), for example from about 0.05 to about 0.49 ohms/m$^2$, and the activated getter film 84 just after activation has a resistance of from about 1 to about 1.5 ohms/m$^2$.

Figure 6:
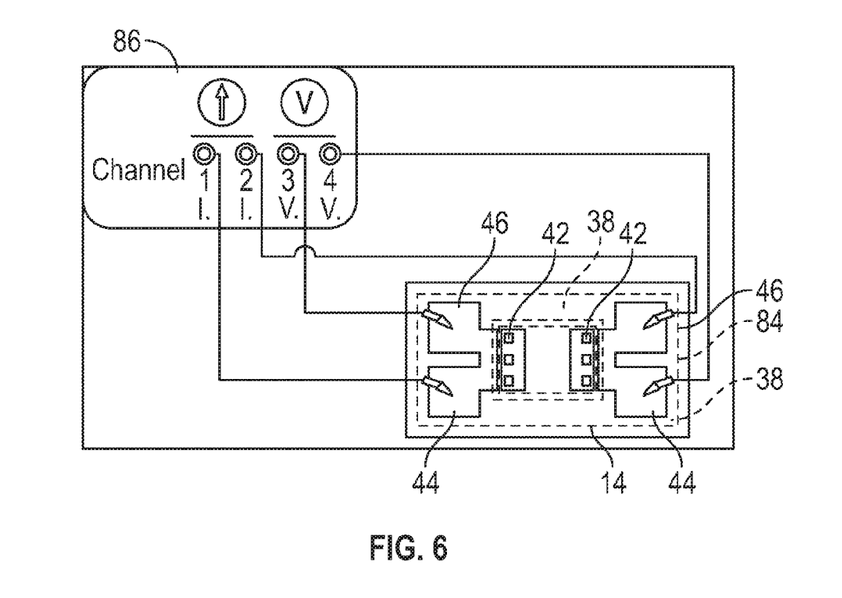
FIG. 6 illustrates, in top view, an electronic device and a method for fabricating an electronic device during a further intermediate fabrication stage in accordance with an exemplary embodiment.
Figure 7:
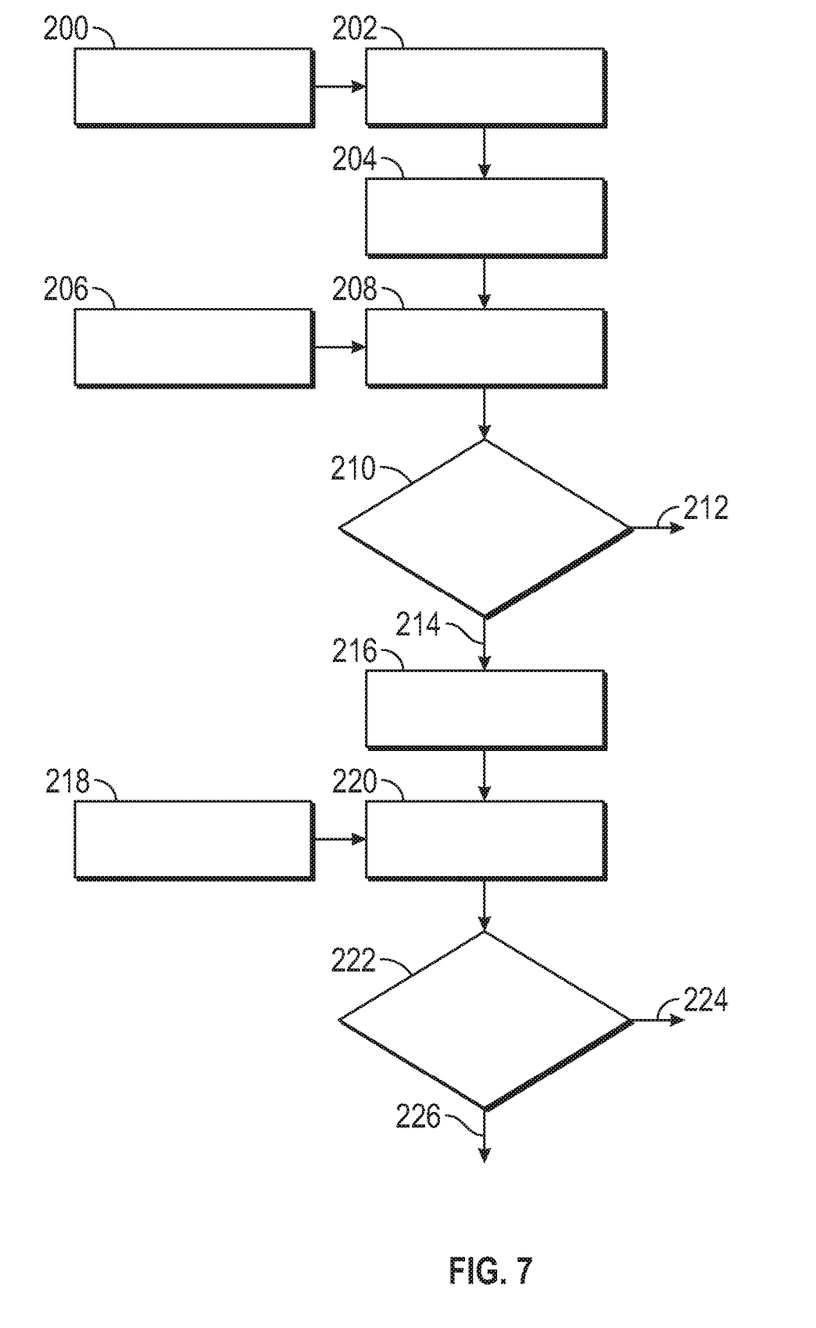
FIG. 7 is a flow chart of an example for fabricating an electronic device during various intermediate fabrication stages in accordance with an embodiment.

FIG. 6 is a top view of the electronic device 14 and a Kelvin measurement arrangement 86 in electrical communication with the electronic device 14 for evaluating the getter film 38 during various intermediate fabrication stages in accordance with an exemplary embodiment. FIG. 7 is a flow chart of an example for evaluating the getter film 38 during various intermediate fabrication stages in accordance with an exemplary embodiment. In an exemplary embodiment, the getter film 38 is evaluated by performing the measurements described below with the electronic device 14 in a clean room environment to advantageously avoid or minimize contamination. Referring to FIGS. 5-7, a resistance ($R_1$) of the getter film 38 is determined before activating the getter film 38 (e.g., either prior to and/or after forming the substantially hermetically sealed cavity 82). In one example, the Kelvin measurement arrangement 86 applies a static current $I_1$ (e.g., electrical input) from channel 1 to the getter film 38 that flows to channel 2 and measures, in response (e.g., output electrical response), a voltage $V_1$ potential between channel 3 and channel 4 (step 200). The Kelvin measurement arrangement 86 then calculates the resistance ($R_1$) (step 202) using the relationship $R_1=V_1/I_1$. Note, the resistance ($R_1$) of the getter film 38 may or may not be possible in some cases, depending on the process flow. As such, if the measurement of the resistance ($R_1$) of the getter film 38 is not performed, alternatively the resistance ($R_1$) can be assessed by using a pre-characterized reference or spec value and compare with a resistance ($R_2$) of the activated getter film 84. For example, the characterization can be done using scribe line test structures or the like.

After measuring $V_1$ and as discussed above, the portions 10 and 74 of the electronic device body structure 12 are sealed together to form the substantially hermetically sealed cavity 82 and the getter film 38 is then activated (step 204) to form the activated getter film 84. In an exemplary embodiment, the resistance ($R_2$) of the activated getter film 84 is determined initially after activating the getter film 38. In one example, the Kelvin measurement arrangement 86 applies a static current $I_2$ (e.g., electrical input) from channel 1 to the activated getter film 84 that flows to channel 2 and measures, in response (e.g., output electrical response), a voltage $V_2$ potential between channel 3 and channel 4 (step 206). The Kelvin measurement arrangement 86 then calculates the resistance ($R_2$) (step 208) using the relationship $R_2=V_2/I_2$.

In an exemplary embodiment, the resistances ($R_2$) and ($R_1$) are compared to determine if the activated getter film 84 can effectively absorb and/or adsorb gas to produce and/or maintain the vacuum condition (step 210) in the substantially hermetically sealed cavity 82. In one example, if the resistance ($R_1$) is equal to the resistance ($R_2$), then the activated getter film 84 is only partially effective or ineffective (e.g. not activated) at absorbing and/or adsorbing gas and therefore, the vacuum quality in the substantially hermetically sealed cavity 82 is unacceptable. As such, the electronic device 14 is identified as a problematic die and excluded along line 212. In another example, if the resistance ($R_2$) is greater than the resistance ($R_1$), then the activated getter film 84 is effective at absorbing and/or adsorbing gas for achieving the vacuum quality in the substantially hermetically sealed cavity 82 to meet a predetermined threshold and is therefore acceptable. As such, the electronic device 14 is advanced along line 214.

Next, the electronic device 14 may be advanced through one or more fabrication stages (step 216) during a period of time. In an exemplary embodiment, after the period of time, a resistance ($R_3$) of the activated getter film 84 is again determined. In one example, the Kelvin measurement arrangement 86 applies a static current $I_3$ (e.g., electrical input) from channel 1 to the activated getter film 84 that flows to channel 2 and measures, in response (e.g., output electrical response), a voltage $V_3$ potential between channel 3 and channel 4 (step 218). The Kelvin measurement arrangement 86 then calculates the resistance ($R_3$) (step 220) using the relationship $R_3=V_3/I_3$.

In an exemplary embodiment, the resistance ($R_3$) is compared to the resistance ($R_2$) or to the resistances ($R_1$) and ($R_2$) to determine if the activated getter film 84 can effectively absorb and/or adsorb gas to produce and/or maintain the vacuum condition (step 222) in the substantially hermetically sealed cavity 82. In one example, if the resistance ($R_2$) is equal to the resistance ($R_3$), then the activated getter film 84 is already saturated and will be ineffective at absorbing and/or adsorbing gas additional gas therefore, the vacuum quality in the substantially hermetically sealed cavity 82 is unacceptable. As such, the electronic device 14 is identified as a problematic die and excluded along line 224. In another example, if the resistance ($R_3$) is greater than the resistances ($R_2$), then the activated getter film 84 is effective at absorbing and/or adsorbing gas for achieving the vacuum quality in the substantially hermetically sealed cavity 82 that meets a predetermined threshold and therefore is acceptable. As such, the electronic device 14 is advanced along line 226 for further processing. In an exemplary embodiment, the activated getter film is acceptable for absorbing and/or adsorbing gas to produce and/or maintain a desired vacuum quality in the substantially hermetically sealed cavity 82 and the resistance ($R_1$) is less than 0.5 ohms/m$^2$, for example from about 0.05 to about 0.49 ohms/m$^2$, the resistance ($R_2$) is at least 0.5 ohms/m$^2$ greater than the resistance ($R_1$), for example, from about 1 to about 1.5 ohms/m$^2$, the resistance ($R_3$) is from about 2 to about 5 ohms/m$^2$, and the output electrical response for determining the resistance ($R_2$) is measured at a time of from about 0 to about 5 minutes after activating the getter film 38, and the output electrical response for determining the resistance ($R_3$) is measured at a time of from about 5 to about 60 minutes after measuring the output electrical response for determining the resistance ($R_2$).

Accordingly, electronic devices and methods for fabricating electronic devices have been described. In an exemplary embodiment, an electronic device includes an electronic device body structure having a substantially hermetically sealed cavity formed therein. A getter film is in fluid communication with the substantially hermetically sealed cavity. Conductive features are accessible from outside the substantially hermetically sealed cavity and are operatively coupled to the getter film for electrical communication with the getter film for determining and/or monitoring if the getter film is functioning properly to produce and/or maintain a vacuum condition in the substantially hermetically sealed cavity.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. An electronic device comprising:
an electronic device body structure having a substantially hermetically sealed cavity formed therein;
a getter film in fluid communication with the substantially hermetically sealed cavity;
conductive features accessible from outside the substantially hermetically sealed cavity and operatively coupled to the getter film for electrical communication with the getter film; and
a Kelvin measurement arrangement in electrical communication with the electronic device for evaluating the getter film.

2. The electronic device of claim 1, wherein the electronic device is configured as a micro-electro-mechanical system (MEMS) device.

3. The electronic device of claim 1, wherein the getter film is activated to effectively absorb and/or adsorb gas to produce and/or maintain a vacuum condition in the substantially hermetically sealed cavity.

4. The electronic device of claim 1, wherein the conductive features comprise a plurality of conductive vias electrically coupled to the getter film and extending in and through the electronic device body structure.

5. The electronic device of claim 4, wherein the electronic device body structure has an outer surface and the conductive vias extend between the outer surface and the getter film that is disposed over an inner surface of the electronic device body structure, and wherein the conductive features further comprise a plurality of conductive pads overlying the outer surface and electrically coupled to the conductive vias for electrical communication with the getter film.

6. The electronic device of claim 1, wherein the getter film is disposed in the substantially hermetically sealed cavity.

7. A method for fabricating an electronic device, the method comprising:
providing an electronic device body structure having a substantially hermetically sealed cavity formed therein;
providing a getter film in fluid communication with the substantially hermetically sealed cavity;
providing conductive features accessible from outside the substantially hermetically sealed cavity and operatively coupled to the getter film for electrical communication with the getter film;
activating the getter film that is in fluid communication with the substantially hermetically sealed cavity in the electronic device body structure of the electronic device to form an activated getter film; and
determining a resistance of the activated getter film using a Kelvin measurement arrangement in electrical communication with the electronic device for evaluating if the activated getter film can effectively absorb and/or adsorb gas to produce and/or maintain a vacuum condition in the substantially hermetically sealed cavity.

8. The method of claim 7, further comprising determining a first resistance ($R_1$) of the getter film before activating the getter film, and wherein determining the resistance of the activated getter film comprises:
determining a second resistance ($R_2$) of the activated getter film initially after activating the getter film, and wherein the method further comprises:
comparing $R_2$ with $R_1$ to determine if the activated getter film can effectively absorb and/or adsorb gas to produce and/or maintain the vacuum condition in the substantially hermetically sealed cavity.

9. The method of claim 8, wherein comparing $R_2$ with $R_1$ comprises determining that the activated getter film can effectively absorb and/or adsorb gas when $R_2 > R_1$.

10. The method of claim 8, wherein determining $R_1$ comprises;
applying a first static current $I_1$ to the getter film and measuring in response a first voltage $V_1$; and
calculating $R_1$ using the relationship $R_1 = V_1/I_1$, and wherein determining $R_2$ comprises:
applying a second static current $I_2$ to the activated getter film and measuring in response a second voltage $V_2$; and
calculating $R_2$ using the relationship $R_2 = V_2/I_2$.

11. The method of claim 8, wherein determining the resistance of the activated getter film comprises:
determining a third resistance ($R_3$) of the activated getter film after making measurements for determining $R_2$, and wherein comparing $R_2$ with $R_1$ further comprises comparing $R_2$ with $R_3$.

12. The method of claim 11, wherein comparing $R_1$, $R_2$, and $R_3$ comprises determining that the activated getter film can effectively absorb and/or adsorb gas when $R_3 > R_2 > R_1$.

13. The method of claim 11, wherein determining $R_2$ comprises measuring an initial electrical response from an initial electrical input to the activated getter film, and wherein determining $R_3$ comprises;
measuring a subsequent electrical response from a subsequent electrical input to the activated getter film at a time of from about 5 to about 60 minutes after measuring the initial electrical response; and
using the subsequent electrical response for determining $R_3$.

14. A method for fabricating an electronic device, the method comprises:
forming a getter film overlying a first portion of an electronic device body structure;
forming conductive features extending through the first portion of the electronic device body structure for operatively coupling the conductive features with the getter film for electrical communication with the getter film;

sealing the first portion of the electronic device body structure with a second portion of the electronic device body structure to form a substantially hermetically sealed cavity in the electronic device body structure such that the getter film is in fluid communication with the substantially hermetically sealed cavity and the conductive features are accessible from outside the substantially hermetically sealed cavity;

heating the electronic device body structure including the getter film after sealing the first portion with the second portion to activate the getter film to form an activated getter film for effectively absorbing and/or adsorbing gas to produce and/or maintain a vacuum condition in the substantially hermetically sealed cavity; and using the conductive features, determining a resistance of the activated getter film using a Kelvin measurement arrangement in electrical communication with the electronic device for evaluating if the activated getter film can effectively absorb and/or adsorb gas to produce and/or maintain the vacuum condition in the substantially hermetically sealed cavity.

15. The method of claim 14, wherein the first portion of the electronic device body structure has an outer surface and an inner surface that is on a side opposite the outer surface and that at least in part defines the substantially hermetically sealed cavity, wherein forming the getter film comprises forming the getter film overlying the inner surface of the first portion.

16. The method of claim 15, wherein forming the conductive features comprises forming conductive vias extending between the inner and outer surfaces of the first portion for electrically coupling to the getter film.

17. The method of claim 16, wherein forming the conductive features comprises forming conductive pads overlying the outer surface of the first portion electrically coupled to the conductive vias.

18. The method of claim 14, further comprising, using the conductive features, determining a first resistance ($R_1$) of the getter film after sealing the first portion with the second portion and before heating the electronic device body structure, and wherein determining the resistance of the activated getter film comprises:

using the conductive features, determining a second resistance ($R_2$) of the activated getter film after activating the getter film, and wherein the method further comprises:

comparing $R_2$ with $R_1$ to determine if the activated getter film can effectively absorb and/or adsorb gas to produce and/or maintain the vacuum condition in the substantially hermetically sealed cavity.

* * * * *